US007126385B2

(12) United States Patent
Brekelmans et al.

(10) Patent No.: US 7,126,385 B2
(45) Date of Patent: Oct. 24, 2006

(54) DIFFERENTIAL INVERTER CIRCUIT

(75) Inventors: Johannes Hubertus Antonius Brekelmans, Eindhoven (NL); Josephus Arnoldus Henricus Maria Kahlman, Eindhoven (NL); Gerben Willem De Jong, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/501,427

(22) PCT Filed: Dec. 12, 2002

(86) PCT No.: PCT/IB02/05344

§ 371 (c)(1),
(2), (4) Date: Jul. 13, 2004

(87) PCT Pub. No.: WO03/061124

PCT Pub. Date: Jul. 24, 2003

(65) Prior Publication Data

US 2005/0012526 A1 Jan. 20, 2005

(30) Foreign Application Priority Data

Jan. 17, 2002 (EP) .................................. 02075197

(51) Int. Cl.
*H03K 5/22* (2006.01)
(52) U.S. Cl. .......................... 327/67; 327/112; 321/185
(58) Field of Classification Search .................. 326/85, 326/86; 327/52, 55, 65, 112, 291, 300, 307, 327/332; 330/258; 331/185

See application file for complete search history.

(56) References Cited

U.S. PATENT DOCUMENTS

| 3,582,802 | A | * | 6/1971 | Weekes et al. ............... 330/258 |
| 4,095,195 | A | | 6/1978 | Saito |
| 5,495,194 | A | * | 2/1996 | Sugawara .................... 327/113 |
| 5,568,561 | A | * | 10/1996 | Whitlock ..................... 381/120 |
| 5,672,983 | A | * | 9/1997 | Yamamoto et al. ............ 326/27 |
| 5,703,532 | A | * | 12/1997 | Shin et al. ................... 330/258 |
| 5,705,946 | A | * | 1/1998 | Yin ............................. 327/333 |
| 5,952,856 | A | * | 9/1999 | Horiguchi et al. .......... 327/110 |
| 6,043,710 | A | * | 3/2000 | Smith et al. ................. 330/254 |
| 6,356,141 | B1 | * | 3/2002 | Yamauchi .................... 327/543 |
| 6,483,281 | B1 | * | 11/2002 | Hwang ........................ 323/299 |
| 6,603,348 | B1 | * | 8/2003 | Preuss et al. ................ 327/563 |
| 6,734,700 | B1 | * | 5/2004 | Chiu et al. ..................... 326/27 |
| 6,794,900 | B1 | * | 9/2004 | Tang et al. .................... 326/86 |
| 2003/0137351 | A1 | * | 7/2003 | Renous et al. .............. 330/260 |
| 2003/0214319 | A1 | * | 11/2003 | Whitworth .................... 326/30 |

* cited by examiner

*Primary Examiner*—Linh My Nguyen
*Assistant Examiner*—Thomas J. Hiltunen
(74) *Attorney, Agent, or Firm*—Aaron Waxler; Paul Im

(57) ABSTRACT

An improved differential inverter comprising a differential inverter having a differential input for receiving a first input signal and a second input signal, said inverter further comprising a differential control input for receiving a first control signal and a second control signal. The improved differential inverter further comprises a differential output for transmitting a first output signal and a second output signal. The improved differential inverter further comprises a controlled bias generator that generates the second vector of input signals in response to a bias control signal. The control bias signal is generated at an output of a voltage divider coupled to the differential output of the differential inverter said bias control signal being indicative for a DC voltage of the of the differential output.

10 Claims, 4 Drawing Sheets

DIFFERENTIAL INVERTER CIRCUIT

The invention relates to an improved differential inverter as described in the preamble of claim 1.

Figure 7:
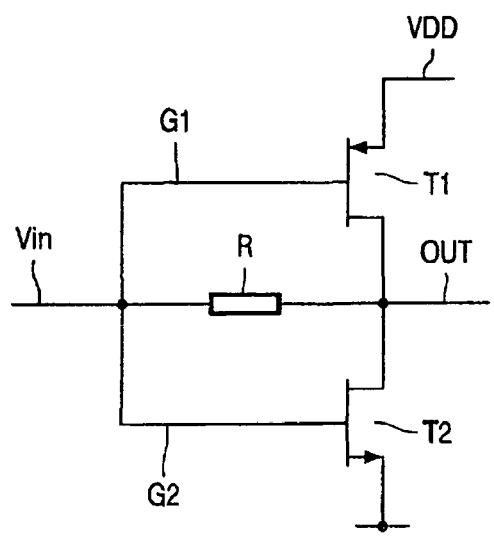

Inverters are very useful electronic devices embedded in both analog and digital circuits. In CMOS technology the inverters architecture is very simple as shown in FIG. 7. The inverter in FIG. 7 comprises a transistor pair, said transistor pair comprising a p-type MOS transistor (T1) coupled to a n-type MOS transistor (T2). The transistors are drain to drain coupled, their control terminals G1 and G2 being connected to each other. In a digital application a binary input signal (Vin) is applied to the transistors control terminals (G1, G2). At an output of the inverter is obtained an output signal (OUT) having one of the possible binary values, i.e. either logical 1 or logical 0, said output signal (OUT) being substantially 180 degree phase-shifted versus the input signal. In linear applications a feedback resistor (R) is connected between the transistors drains and the transistors grids. In this way a stable operating point for the transistor pair is obtained. For this application an important parameter is the transconductance gm of the transistor pair. Mathematically the transconductance could be expressed as in relation (1).

$$gm = \beta(V_{GS} - V_{TH}) \quad (1)$$

In relation (1) $\beta$ is a parameter depending on geometrical properties of the transistors i.e. it's width (W) and it's length (L). $V_{GS}$ is a voltage between the grid and the source of the transistor. $V_{TH}$ is a threshold voltage i.e. the voltage required for the transistor to turn on and to conduct a drain current. $V_{TH}$ also depends on the technology. From relation (1) results that the transconductance gm could be controlled by controlling one or a combination of the parameters $\beta$, $V_{GS}$, $V_{TH}$. In applications where a supply voltage for the transistor pair is relatively low e.g. 0.5 V it is necessary to obtain an as large as possible gm in applications like buffering and oscillation generation.

In U.S. Pat. No. 4,387,349 is considered an inverter used in a crystal oscillator for generating an oscillation. The crystal oscillator disclosed in this patent is realized using a CMOS transistor pair comprising a p-type transistor connected to a n-type transistor. The grids of the transistors are coupled via a capacitor. Each of the grids is further coupled to a reference voltage generator for biasing the transistor pair in class B. In oscillators this could be a suitable solution for biasing but when linear applications are considered the buffer must be biased in class A for providing a maximum linearity. A suitable inverter suitable for both linear applications and oscillation generation could be therefore realized in a device having different reference voltages, reference voltages depending on the type of the application i.e. linear or oscillation generation. This solution increases the complexity and cost of the circuit. Furthermore in differential applications where two transistor pairs are used, it is desirable that both transistor pairs have substantially equal characteristics as e.g. gm and DC operating point. This is technologically impossible to be obtained with a fix bias and could result in a differential stage that does not work properly. That is why it is desirable to have biasing for transistor pairs used in differential applications for both linear applications and oscillations generation.

It is therefore an object of the present invention to provide an improved CMOS inverter suitable for differential applications.

In accordance with the invention this is achieved in a device as described in the preamble of claim 1 being characterized in that it further comprises a controlled bias generator generating the second vector of input signals in response to a bias control signal which is generated at an output of a voltage divider coupled to the differential output of the differential inverter said bias control signal being indicative for a DC voltage of the of the differential output.

A differential inverter has two output terminals for generating the first output signal and the second output signal that are substantially in anti-phase i.e. phase shifted with 180 degrees to each other. Two resistor means equal to each other e.g. in the simplest way simple resistors are connected in series to each other between the output terminals. Because the first and the second output signals are in anti-phase an AC voltage measured in the connection point of the two resistor means would be substantially zero volt. In the same time, a DC voltage measured in the same point would be substantially an average of the DC voltages of the outputs of the inverter. A DC voltage difference between the two outputs is sensed and a bias control signal is generated. The bias control signal is inputted to a controlled bias generator, said controlled bias generator generating the second pair of input signals comprising a first control signal and a second control signal. The first control signal and the second control signals are DC voltage signals controlling the differential inverter in such a way that a DC difference between the first output signal and the second output signal is as small as possible, ideally zero.

In an embodiment of the invention the differential inverter comprises a first transistor pair and a second transistor pair each of the transistor pairs comprising a n-type MOS transistor coupled to a p-type MOS transistor via a drain to drain connection, the n-type transistor having a first control terminal for receiving a component of the second vector of input signals via a third resistor means and the p-type transistor having a second control terminal for receiving a component of the second vector of input signals via a fourth resistor means.

In another embodiment of the invention the control bias generator comprises a first CMOS inverter coupled to a second CMOS inverter and to a third CMOS inverter, the first CMOS inverter receiving the bias control signal and generating a variable control signal proportional to the bias control signal to be inputted in the second CMOS inverter and in the third CMOS inverter, the second CMOS inverter and the third CMOS inverter generating the second vector of input signals in response to the variable control signal. When the bias control signal is substantially half of the supply voltage the first control signal is a voltage higher than half of a supply voltage and the second control signal is lower than half of the supply voltage. The third and the second control signals determines the $V_{GS}$ voltages of the transistor pairs in the differential inverter that further determines the gm parameter of the transistor pairs as results from relation (1).

In an embodiment of the invention any of the CMOS inverters included in the controlled bias generator comprises a pair of p-type MOS transistor coupled to n-type MOS transistor said transistors having different geometrical properties. If a MOS transistor pair is realized with matched transistors the output DC voltage is, ideally, half of the supply voltage. A drain current of a MOS transistor depends, in a first approximation, on the geometrical properties of the transistor as in equation (2).

$$I_D = k\frac{W}{L}(V_{GS} - V_{TH})^2 \quad (2)$$

In equation (2) $I_D$ is the drain current, k depends on the technology used, W is a width of the transistor and L is a length of the transistor, the other symbols being as in equation (1). A geometrical parameter that could better define the geometrical properties of the MOS transistors is their area, i.e. A=W*L. In a specific technology one of the area parameters is maintained constant for all the transistors e.g. L, while the other is modified e.g. W. Using this procedure transistors could be obtained having different electrical characteristics as it is indicated in relation (2).

In another embodiment of the invention it is presented a differential oscillator comprising an improved differential inverter, said differential oscillator having a LC tank circuit coupled between the differential output terminals of the improved differential inverter, the differential output terminal being cross-coupled to the differential input.

In oscillation applications it is desirable to use as efficient as possible the power supply source especially when relatively low voltage e.g. 0.5 V battery operating circuits are considered. That is why in these applications the classical oscillator circuits cannot be used. Because of the technological imperfections the DC output of the transistor pairs is not half of the supply voltage and the transistor pair does not provide a high gin and either the oscillator does not start it's oscillation or the oscillation is not symmetrical. The oscillator of the present invention has a bias that is continuously adapted to the variations of the DC operating point of the transistor pairs.

Figure 1:
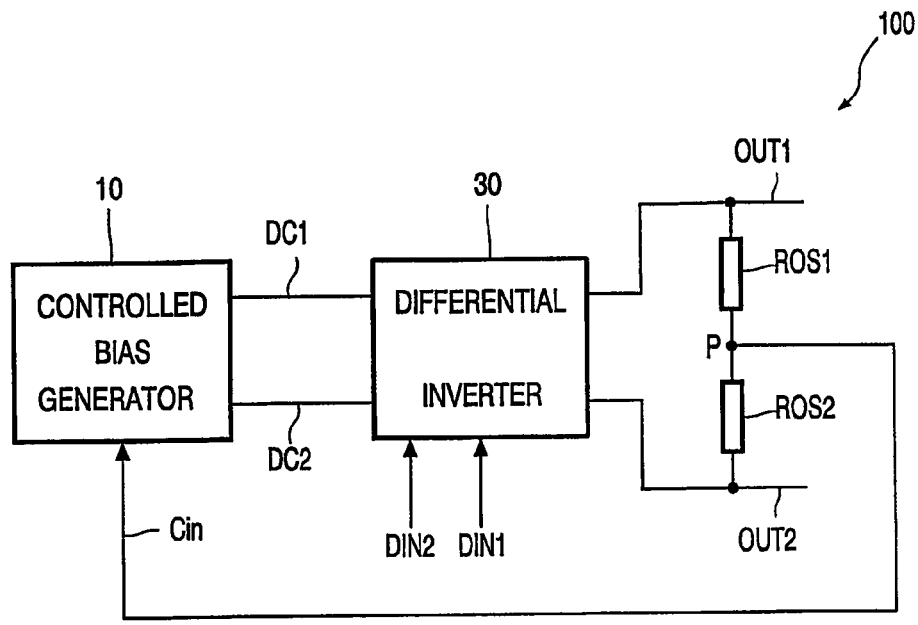
Figure 2:
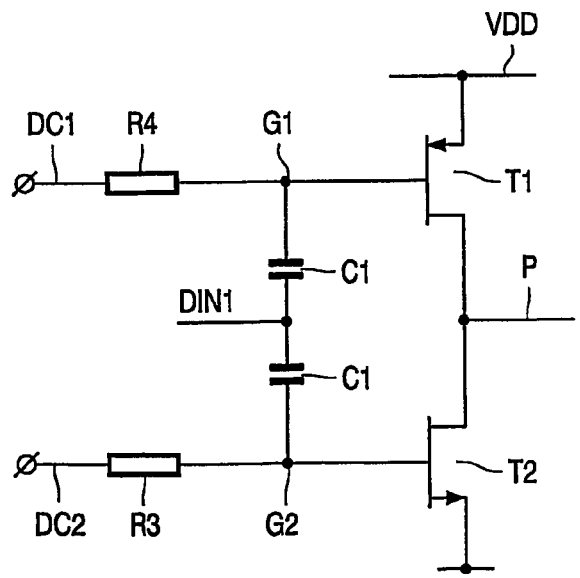
Figure 3:
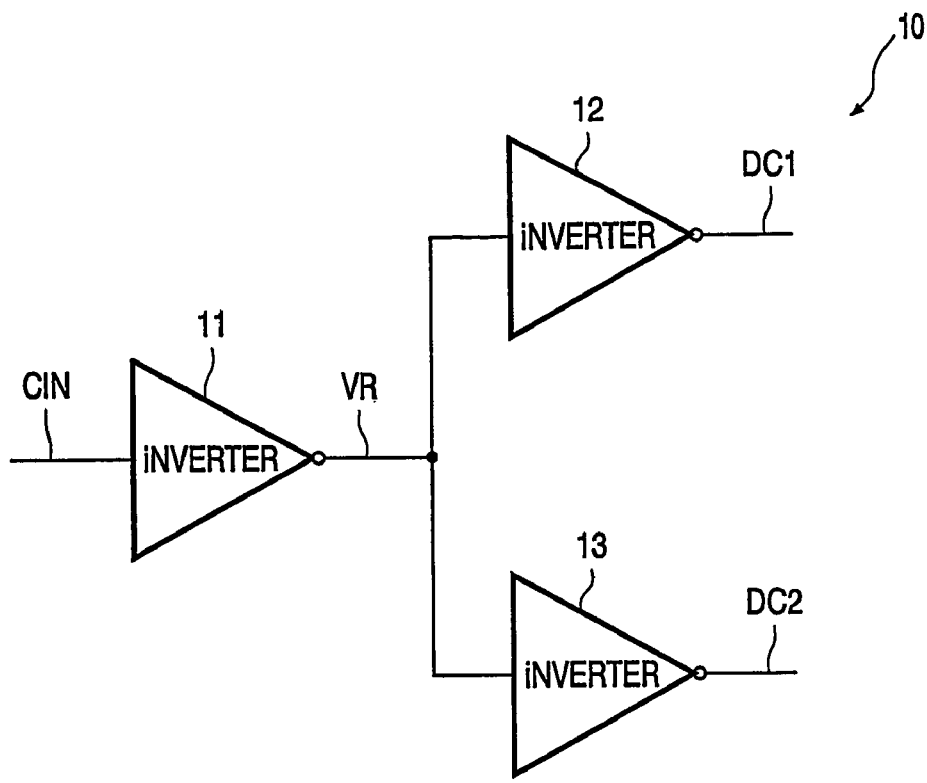
Figure 4:
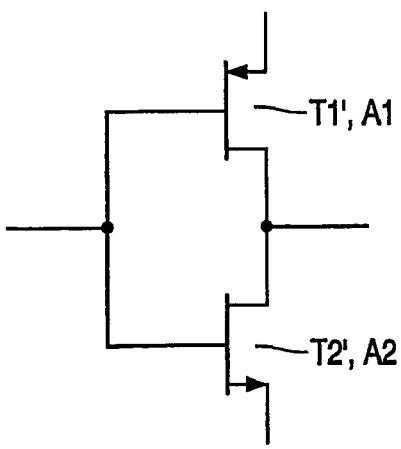
Figure 5:
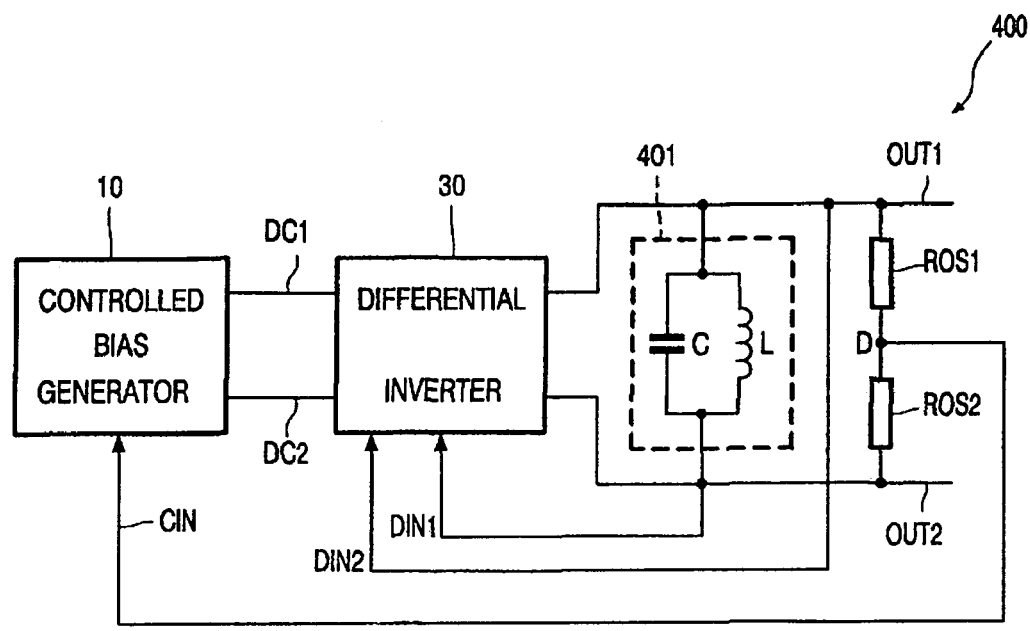
Figure 6:
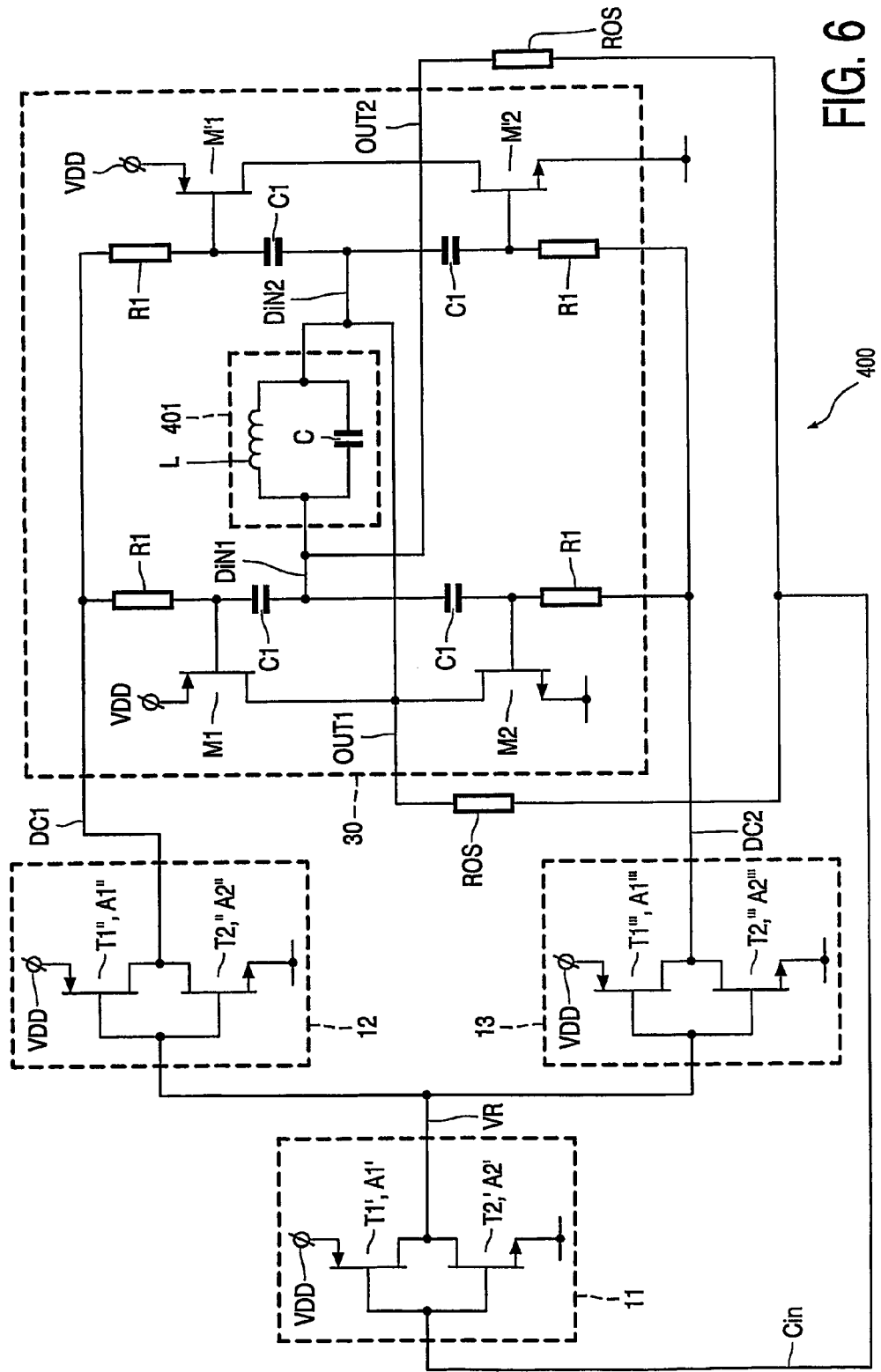

The above and other features and advantages of the invention will be apparent from the following description of the exemplary embodiments of the invention with reference to the accompanying drawings, in which:

FIG. 1 depicts a block diagram of an improved differential inverter according to the present invention, FIG. 2 depicts a detailed diagram of a transistor pair included in the differential inverter according to the present invention, FIG. 3 depicts an embodiment of the controlled bias generator according to the present invention, FIG. 4 depicts an embodiment of an inverter included in the controlled bias generator according to the invention, FIG. 5 depicts a block diagram of an oscillator using the improved differential inverter according to the invention, FIG. 6 depicts a detailed diagram of the oscillator according to the invention FIG. 7 depicts a CMOS inverter as known in the art, FIG. 1 depicts a block diagram of an improved differential inverter according to the present invention. The improved differential inverter 100 comprises a differential inverter 30 having a differential input for receiving a first vector of signals comprising a first input signal DIN1 and a second input signal DIN2. The improved differential inverter 100 further comprises a differential control input for receiving a second vector of input signals said vector comprising a first a first control signal DC1 and a second control signal DC2. The improved differential inverter has a differential output for transmitting a third vector of differential signals said vector comprising a first output signal OUT1 and a second output signal OUT2.

The improved differential inverter 100 further comprises a controlled bias generator 10 generating the second vector of input signals comprising a first control signal DC1 and a second control signal DC2. Said second vector of signals is generated in response to a bias control signal Cin. The bias control signal is obtained in a coupling point P of a first resistor means Ros1 to a second resistor means Ros2 substantially equal to the first resistor means Ros1. An end of the first resistor means Ros1 and an end of the second resistor means Ros2 are coupled to the differential output. If we note the DC voltage of the signal OUT1 as $V_1$ and the DC voltage of the signal OUT2 as $V_2$ the DC voltage measured in the point P is $(V_1+V_2)/2$. It should be pointed out here that because an AC component of $V_1$ is substantially in anti-phase with an AC component of $V_2$ the AC component in the voltage measured in point P is substantially zero. Ideally V1 equals the voltage V2 and $V_2$ equals half of the supply voltage of the transistor pair. In this situation the DC voltage measured in point P is half of the supply voltage. In a real circuit there is a difference between $V_1$ and $V_2$ the DC voltage measured in the point P being either above or below half of the supply voltage. This determines the controlled bias generator 10 to provide a second vector of input signals for controlling the bias of the differential inverter in such a way that the transconductance of the differential inverter 10 is as high as possible.

FIG. 2 depicts a detailed diagram of a transistor pair included in the differential inverter according to the present invention. The differential inverter 10 comprises a first transistor pair and a second transistor pair. Each of the transistor pairs comprises a n-type MOS transistor T2 coupled to a p-type MOS transistor T1 via a drain to drain connection. The n-type transistor T2 has a first control terminal G2 for receiving the second control signal DC2 via a third resistor means R1. The p-type transistor T1 has a second control terminal G1 for receiving the first control signal DC1 of the second vector of input signals via a fourth resistor means R1. The third resistor means R1 and the fourth resistor means R1 couple the gates of the transistors to the first control signal DC1 and to the second control signal DC2 respectively. The first control signal is lower than half of the supply voltage Vdd and the second control signal DC2 is higher than half of the supply voltage Vdd. Capacitors C1 are used to de-couple the AC current components from DC current components and must have a much lower impedance value than the parasitic input capacitance of the transistors.

FIG. 3 depicts an embodiment of the controlled bias generator 10 according to the present invention. The control bias generator 10 comprises a first CMOS inverter 11 coupled to a second CMOS inverter 12 and to a third CMOS inverter 13. The first CMOS inverter 11 receives the bias control signal Cin and generates a variable control signal VR to be inputted in the second CMOS inverter 12 and in the third CMOS inverter 13. The second CMOS inverter 12 and the third CMOS inverter generate the second vector of input signals DC1, DC2 in response to the variable control signal VR.

FIG. 4 depicts an embodiment of an inverter included in the controlled bias generator 10 according to the invention. Any of the inverters included in the controlled bias generator comprises a pair of CMOS transistors $T_1'$ and $T_2'$ connected drain to drain. Their controlled terminals i.e. gate terminals are also connected to each other. The transistors are characterized in that they have different geometrical properties i.e. they have different areas A1 and A2, respectively. Normally the length L of the two transistors is equal to each other while their width W is different. In this way the DC operating point e.g. their drain currents depend on the geometrical properties of the transistors as results from relation (2). In the situation when the drain currents are equal to each other i.e. the transistors have equal areas the DC voltage measured at their drain terminals is half of the supply voltage, otherwise the DC voltage depends on a ratio of the areas of the transistors.

FIG. 5 depicts a block diagram of an oscillator 400 using the improved differential inverter 100 according to the invention. The differential oscillator 400 comprises an improved differential inverter 100, said differential oscillator 400 having a LC tank circuit 401 coupled between the differential output terminals of the improved differential inverter 100, the differential output terminal being cross-coupled to the differential input. With this circuit a periodical waveform is generated. The LC tank circuit 401 determines the oscillation frequency of the oscillator 400. In relatively low voltage supply applications e.g. 0.5 V it is very important that the oscillator provides as much as possible energy at it's output in order to use the supply source as efficient as possible. The efficiency is substantially maximal when a DC voltage at any of the oscillator outputs is half of the supply voltage when sinusoidal oscillation is considered. Sinusoidal oscillation is necessary especially in applications as e.g. mixers in transceivers. In applications where the physical conditions are not so tight e.g. in quartz based oscillators the differential control input terminals of the differential inverter could be connected to fixed voltage terminals e.g. the reference terminal and the power supply terminal as in U.S. Pat. No. 4,095,195. This solution is not suitable for a LC oscillator working at relatively low supply voltage because if technologically the transistors included in a transistor pair are not substantially identical to each other the oscillation could not start. In the present application, even if the transistors are not technologically identical to each other the controlled bias generator provides the proper DC bias signals for the transistors in response to the control Cin signal and the oscillation starts easily.

FIG. 6 depicts a detailed diagram of the oscillator 400 according to the invention. In FIG. 6 the building blocks previously described are identified in dotted lines. The differential inverter 30 is realized with a first pair of transistors M1, M2 and a second pair of transistors M1' and M2'. The third resistor means R1 couples the gates of the transistors either to the first control signal DC1 or to the second control signal DC2. The first control signal is lower than half of the supply voltage Vdd and the second control signal DC2 is higher than half of the supply voltage Vdd. Capacitors C1 are used to de-couple the AC current components from DC current components and must have a much lower value than the parasitic input capacitance of the transistors. The inverters 11, 12 and 13 are realized with the transistor pairs (T1', T2'), (T1", T2") and (T1''', T2''') respectively. Each of the transistor pairs included in the inverters comprises transistors having different area.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features. The term 'grid' and 'gate' refer to the control input of a MOS transistor.

The invention claimed is:

1. An improved differential inverter (100) comprising a differential inverter (30) having
a differential input for receiving a first vector of signals comprising a first input signal (DIN1) and a second input signal (DIN2)
a differential control input for receiving a second vector of input signals comprising a first a first control signal (DC1) and a second control signal (DC2),
a differential output for transmitting a third vector of differential signals comprising a first output signal (OUT1) and a second output signal (OUT2)
said improved differential inverter (100) being characterized in that it further comprises a controlled bias generator (10) generating the second vector of input signals in response to a bias control signal (Cin) which is generated at an output of a voltage divider coupled to the differential output of the differential inverter (30) said bias control signal being indicative of a DC voltage of the of the differential output wherein the differential inverter (30) comprises a first transistor pair and a second transistor pair each of the transistor pairs comprising a n-type MOS transistor (T2) coupled to a p-type MOS transistor (T1) via a drain to drain connection, the n-type transistor (T2) having a first control terminal (G2) for receiving the second control signal (DC2) via a third resistor means (R3), the p-type transistor (T1) having a second control terminal (G1) for receiving the first control signal (DC1) via a fourth resistor means (R4).

2. An improved differential inverter (100) as claimed in claim 1 wherein the bias control signal (Cin) is generated in a coupling point (P) of a first resistor means (Ros1) to a second resistor means (Ros2) substantially equal to the first resistor means (Ros1), an end of the first resistor means (Ros1) and an end of the second resistor means being coupled to the differential output.

3. An improved differential inverter (100) comprising a differential inverter (30) having
a differential input for receiving a first vector of signals comprising a first input signal (DIN1) and a second input signal (DIN2)
a differential control input for receiving a second vector of input signals comprising a first a first control signal (DC1) and a second control signal (DC2),
a differential output for transmitting a third vector of differential signals comprising a first output signal (OUT1) and a second output signal (OUT2)
said improved differential inverter (100) being characterized in that it further comprises a controlled bias generator (10) generating the second vector of input signals in response to bias control signal (Cin) which is generated at an output of a voltage divider coupled to the differential output of the differential inverter (30) said bias control signal being indicative of a DC voltage of the of the differential output, wherein the control bias generator (10) comprises a first CMOS inverter (11) coupled to a second CMOS inverter (12) and to a third CMOS inverter (13), the first CMOS inverter (11) receiving the bias control signal (Cin) and generating a variable control signal (VR) that is inputted to the second CMOS inverter (12) and to the third CMOS inverter (13), the second CMOS inverter (12) and the third CMOS inverter generating the second vector of input signals (DC1, DC2) in response to the variable control signal (VR).

4. An improved differential inverter (100) as claimed in claim 3 wherein any of the CMOS inverters included in the controlled bias generator (10) comprises a pair of a p-type MOS transistor (T1) and a n-type MOS transistor (T2) said transistors being mutually coupled and having different geometrical properties A1' and A2', respectively.

5. A differential oscillator (400) comprising an improved differential inverter (100) comprising a differential inverter (30) having
a differential input for receiving a first vector of signals comprising a first input signal (DIN1) and a second input signal (DIN2)
a differential control input for receiving a second vector of input signals comprising a first a first control signal (DC1) and a second-control signal (DC2),
a differential output for transmitting a third vector of differential signals comprising a first output signal (OUT1) and a second output signal (OUT2)
said improved differential inverter (100) being characterized in that it further comprises a controlled bias generator (10) generating the second vector of input signals in response to a bias control signal (Cin) which is generated at an output of a voltage divider coupled to the differential output of the differential inverter (30) said bias control signal being indicative of a DC voltage of the of the differential output, said differential oscillator having a LC tank circuit (401) coupled between the terminals of the differential output of the improved differential inverter (100), the terminals of the differential output being cross-coupled to the differential input.

6. A differential inverter comprising:
a differential input operative to receive a first vector of signals comprising a first input signal and a second input signal;
a differential control input operative to receive a second vector of input signals comprising a first a first control signal and a second control signal;
a differential output adapted to transmit a third vector of differential signals comprising a first output signal and a second output signal; and
a controlled bias generator operative to generate the second vector of input signals in response to a bias control signal, which is generated at an output of a voltage divider coupled to the differential output of the differential inverter, wherein the bias control signal is indicative of a DC voltage of the of the differential output, wherein the differential inverter comprises a first transistor pair and a second transistor pair each of the transistor pairs comprising a n-type MOS transistor coupled to a p-type MOS transistor via a drain to drain connection, the n-type transistor having a first control terminal for receiving the second control signal via a third resistor, the p-type transistor having a second control terminal operative to receive the first control signal via a fourth resistor.

7. A differential inverter as claimed in claim 6, wherein the bias control signal is generated in a coupling point of a first resistor to a second resistor substantially equal to the first resistor, wherein an end of the first resistor and an end of the second resistor are coupled to the differential output.

8. A differential inverter comprising:
a differential input operative to receive a first vector of signals comprising a first input signal and a second input signal;
a differential control input operative to receive a second vector of input signal comprising a first a first control signal and a second control signal;
a differential output adapted to transmit a third vector of differential signals comprising a first output signal and a second output signal; and
a controlled bias generator operative to generate the second vector of input signals in response to a bias control signal, which is generated at an output of a voltage divider coupled to the differential output of the differential inverter, wherein the bias control signal is indicative of a DC voltage of the of the differential output, wherein the control bias generator comprises a first CMOS inverter coupled to a second CMOS inverter and to a third CMOS inverter, wherein the first CMOS inverter (11) receives the bias control signal and generating a variable control signal that is input to the second CMOS inverter and to the third CMOS inverter, the second CMOS inverter and the third CMOS inverter generating the second vector of input signals in response to the variable control signal.

9. A differential inverter as claimed in claim 8, wherein any of the CMOS inverters included in the controlled bias generator comprises a pair of a p-type MOS transistor and a n-type MOS transistor, the transistors being mutually coupled and having different geometrical properties A1' and A2', respectively.

10. A differential oscillator comprising a differential inverter comprising:
a differential input operative to receive a first vector of signals comprising a first input signal and a second input signal;
a differential control input operative to receive a second vector of input signals comprising a first a first control signal and a second control signal;
a differential output adapted to transmit a third vector of differential signals comprising a first output signal and a second output signal; and
a controlled bias generator operative to generate the second vector of input signals in response to a bias control signal, which is generated at an output of a voltage divider coupled to the differential output of the differential inverter, wherein the bias control signal is indicative of a DC voltage of the of the differential output, the differential oscillator having a LC tank circuit coupled between the terminals of the differential output of the differential inverter, the terminals of the differential output being cross-coupled to the differential input.

* * * * *